(12) United States Patent
Hu

(10) Patent No.: US 12,068,416 B2
(45) Date of Patent: Aug. 20, 2024

(54) THIN FILM TRANSISTOR AND MANUFACTURING METHOD THEREOF

(71) Applicant: TCL CHINA STAR OPTOELECTRONICS TECHNOLOGY CO., LTD., Shenzhen (CN)

(72) Inventor: Xiaobo Hu, Shenzhen (CN)

( * ) Notice: Subject to any disclaimer, the term of this patent is extended or adjusted under 35 U.S.C. 154(b) by 780 days.

(21) Appl. No.: 17/261,015

(22) PCT Filed: Dec. 29, 2020

(86) PCT No.: PCT/CN2020/141117
§ 371 (c)(1),
(2) Date: Jan. 17, 2021

(87) PCT Pub. No.: WO2022/116336
PCT Pub. Date: Jun. 9, 2022

(65) Prior Publication Data
US 2022/0406940 A1   Dec. 22, 2022

(30) Foreign Application Priority Data

Dec. 3, 2020 (CN) .......................... 202011404577.0

(51) Int. Cl.
*H01L 29/786* (2006.01)
*H01L 29/417* (2006.01)
*H01L 29/66* (2006.01)

(52) U.S. Cl.
CPC .... *H01L 29/7869* (2013.01); *H01L 29/41733* (2013.01); *H01L 29/66742* (2013.01)

(58) Field of Classification Search
CPC ........... H01L 29/7869; H01L 29/41733; H01L 29/45; H01L 29/4908; H01L 29/42384; H01L 29/66742–6678; H01L 29/786–78696; H01L 29/6675
See application file for complete search history.

(56) References Cited

U.S. PATENT DOCUMENTS

| 2014/0021475 | A1* | 1/2014 | Moon | H01L 29/66765 |
| | | | | 438/34 |
| 2015/0069382 | A1 | 3/2015 | Ahn et al. | |
| 2017/0040343 | A1* | 2/2017 | Hsin | H01L 21/77 |
| 2017/0110591 | A1* | 4/2017 | Bang | H01L 29/41733 |
| 2017/0256620 | A1* | 9/2017 | Lin | H01L 29/41775 |

(Continued)

FOREIGN PATENT DOCUMENTS

| CN | 1828886 A | 9/2006 |
| CN | 1959513 A | 5/2007 |

(Continued)

*Primary Examiner* — Wasiul Haider

(57) ABSTRACT

A thin film transistor and a manufacturing method thereof are provided. The thin film transistor includes a composite electrode including a barrier layer and an electrode layer. The barrier layer has a protruding part relative to the electrode layer, an orthographic projection of the protruding part on the composite electrode protrudes beyond an orthographic projection of the electrode layer on the composite electrode, and a length of the protruding part ranges from 0.3 um to 0.5 um. The thin film transistor and the manufacturing method thereof of the present disclosure can relieve light leakage, thereby improving a contrast ratio of products.

19 Claims, 2 Drawing Sheets

(56) References Cited

U.S. PATENT DOCUMENTS

2018/0120612 A1* 5/2018 Lius .................... H01L 27/1251
2019/0221443 A1* 7/2019 Chen ................. H01L 29/66742

FOREIGN PATENT DOCUMENTS

| CN | 104157696 A | 11/2014 |
| CN | 105702744 A | 6/2016 |
| CN | 106328714 A | 1/2017 |
| CN | 107154403 A | 9/2017 |
| CN | 108682693 A | 10/2018 |
| CN | 110416274 A | 11/2019 |
| CN | 110867458 A | 3/2020 |

* cited by examiner

THIN FILM TRANSISTOR AND MANUFACTURING METHOD THEREOF

CROSS REFERENCE TO RELATED APPLICATIONS

The present application claims priority of the Chinese patent application No. CN202011404577.0, filed on Dec. 3, 2020 with the National Intellectual Property Administration, titled "THIN FILM TRANSISTOR AND MANUFACTURING METHOD THEREOF", which is incorporated by reference in the present application in its entirety.

FIELD OF INVENTION

The present disclosure relates to the field of display technologies, and more particularly, to a thin film transistor and a manufacturing method thereof.

BACKGROUND OF INVENTION

With development of display technologies, requirements for image quality of liquid crystal displays (LCDs) are getting higher. Therefore, it is necessary to improve a contrast ratio of the LCDs.

However, in the LCDs, when a polarization direction of polarized light emitted by backlight is not parallel to or perpendicular to an edge of metals, electrons at surfaces of the edge of metals will be excited by an electric field of the polarized light, thereby changing the polarization direction of the polarized light and finally causing a part of the polarized light to emit from an upper polarizer, which causes light leakage, thereby causing dark-state light leakage and reducing a contrast ratio of products.

In addition, in current thin film transistor (TFT) panels, a copper (Cu) process has become a mainstream. Due to poor adhesion of Cu, it is generally accompanied by metal deposition of barrier layers. It is difficult to form protruding parts (tails) for the barrier layers using common materials, and a structure of barrier layer/copper has an undercut structure.

Therefore, it is necessary to provide a thin film transistor and a manufacturing method thereof to solve the above technical problem.

SUMMARY OF INVENTION

In order to solve the above technical problems, the thin film transistor and the manufacturing method thereof of the present disclosure can prevent a structure of barrier layer/electrode layer from having an undercut structure and allows the barrier layers to have longer protruding parts by composite electrodes having barrier layers and electrode layers manufactured by specific materials. Therefore, the light leakage can be relieved and the contrast ratio of products can be improved.

The present disclosure provides a thin film transistor, which includes at least one composite electrode including a barrier layer and an electrode layer; wherein the barrier layer has a protruding part relative to the electrode layer, an orthographic projection of the protruding part on the electrode layer protrudes beyond the electrode layer, and a length of the protruding part ranges from 0.3 um to 0.5 um, and a material of the barrier layer includes at least one metal and at least one metal oxide, a mass content of the metal oxide ranges from 1% to 10%, and a material of the electrode layer is copper.

Further, the metal is at least one of Mo, Ti, or Nb.

Further, the metal oxide is at least one of $TiO_2$, $TaO_2$, $WO_2$, or $Nb_2O_5$.

Further, the material of the barrier layer includes Mo, Ti, and $TiO_2$.

Further, the thin film transistor includes a gate electrode, a source electrode, and a drain electrode, and the composite electrode includes at least one of the gate electrode, the source electrode, or the drain electrode.

The present disclosure provides a thin film transistor, which includes at least one composite electrode including a barrier layer and an electrode layer; wherein the barrier layer has a protruding part relative to the electrode layer, an orthographic projection of the protruding part on the electrode layer protrudes beyond the electrode layer, and a length of the protruding part ranges from 0.3 um to 0.5 um.

Further, a material of the barrier layer includes at least one metal and at least one metal oxide, and a mass content of the metal oxide ranges from 1% to 10%.

Further, the metal is at least one of Mo, Ti, or Nb.

Further, the metal oxide is at least one of $TiO_2$, $TaO_2$, $WO_2$, or $Nb_2O_5$.

Further, the material of the barrier layer includes Mo, Ti, and $TiO_2$.

Further, a material of the electrode layer is copper.

Further, the thin film transistor includes a gate electrode, a source electrode, and a drain electrode, and the composite electrode includes at least one of the gate electrode, the source electrode, or the drain electrode.

The present disclosure further provides a manufacturing method of a thin film transistor, which includes a step of manufacturing a composite electrode on a substrate; wherein the composite electrode includes a barrier layer and an electrode layer, the barrier layer has a protruding part relative to the electrode layer, an orthographic projection of the protruding part on the electrode layer protrudes beyond the electrode layer, and a length of the protruding part ranges from 0.3 um to 0.5 um.

Further, the composite electrode is manufactured by following steps: a step of manufacturing a target material layer on the substrate;

a step of manufacturing a conductive layer on the target material layer; and a step of patterning the target material layer and the conductive layer to obtain the barrier layer and the electrode layer, respectively.

Further, a composite layer is etched using an acidic cupric etching solution of a hydrogen peroxide system to form the composite electrode.

Further, a material of the target material layer includes at least one metal and at least one metal oxide, and a mass content of the metal oxide ranges from 1% to 10%.

Further, the metal is at least one of Mo, Ti, or Nb.

Further, the metal oxide is at least one of $TiO_2$, $TaO_2$, $WO_2$, or $Nb_2O_5$.

Further, the material of the target material layer includes Mo, Ti, and $TiO_2$.

Further, a material of the conductive layer is copper.

In a preferred embodiment, a manufacturing method of at least one electrode includes: a step of manufacturing a target material layer on the substrate, wherein, a material of the target material layer includes at least one metal and at least one metal oxide, a mass content of the metal oxide ranges from 1% to 10%, the metal is at least one of Mo, Ti, or Nb, and the metal oxide is at least one of $TiO_2$, $TaO_2$, $WO_2$, or $Nb_2O_5$; a step of manufacturing a conductive layer on the target material layer, wherein, a material of the conductive layer is copper; and a step of patterning the target material layer and the conductive layer to obtain the barrier layer and the electrode layer, respectively.

Beneficial effects: the thin film transistor and the manufacturing method thereof of the present disclosure can allow the barrier layer to have a longer protruding part by using specific materials to manufacture the barrier layer, which solves a problem of existing barrier layers having difficulty to form protruding parts and then relieves light leakage, thereby improving a contrast ratio of products. In addition, the thin film transistor and the manufacturing method thereof of the present disclosure can also solve an undercut problem in existing structures of barrier layer/electrode layer.

DESCRIPTION OF DRAWINGS

The following detailed description of specific embodiments of the present disclosure will make the technical solutions and other beneficial effects of the present disclosure obvious with reference to the accompanying drawings.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

Figure 1:
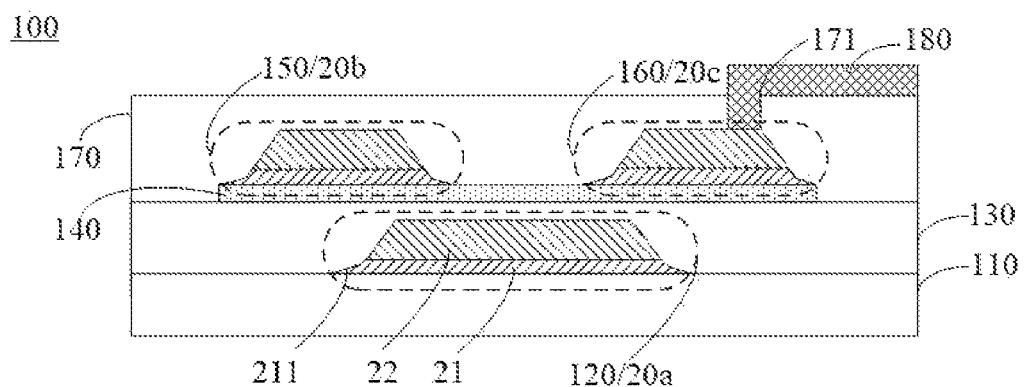
FIG. 1 is a schematic structural diagram of a thin film transistor according to an embodiment of the present disclosure.

FIG. 1 is a schematic structural diagram of a thin film transistor according to an embodiment of the present disclosure. As shown in FIG. 1, the present disclosure provides a thin film transistor (TFT) 100. The thin film transistor 100 includes at least one composite electrode including an electrode layer 22 and a barrier layer 21. The barrier layer 21 has a protruding part 211 relative to the electrode layer 22, and an orthographic projection of the protruding part 211 on the composite electrode protrudes beyond an orthographic projection of the electrode layer 22 on the composite electrode. A length of the protruding part 211 ranges from 0.3 um to 0.5 um.

Therefore, the thin film transistor 100 of the present disclosure can solve a problem of poor adhesion of the electrode layer 22 by forming the composite electrode having the barrier layer 21. At a same time, by forming the protruding part 211 having a longer length, the protruding part 211 can shield edges of the electrode layer 21, which can solve light leakage caused by the electrode layer 21 changing a polarization direction of polarized light from backlight, thereby preventing a contrast ratio of products from reducing.

Further, a material of the barrier layer 21 includes at least one metal and at least one metal oxide, and a mass content of the metal oxide ranges from 1% to 10%.

It should be noted that the barrier layer 21 has conductivity. Those skilled in the art can understand that the barrier layer 21 is formed by one or more of materials of the metal oxide and the metal, which have conductivity and do not affect normal work of the electrode layer 22, and in addition, these types of materials have better adhesion, which can improve adhesion between the electrode layer 22 and other film layers of the thin film transistor 100.

Specifically, the metal may be at least one of molybdenum (Mo), titanium (Ti), or niobium (Nb). The metal oxide may be at least one of titanium dioxide (TiO2), tantalum dioxide (TaO2), tungsten oxide (WO2), or niobium oxide (Nb2O5).

In a specific embodiment, the metal may be, but is not limited to, Mo, MoTi, or MoNb. For example, in this embodiment, the material of the barrier layer 21 uses a target material of MoTi—TiO2. Since MoTi—TiO2 has a lower etching rate, a longer protruding part (tail) 211 can be obtained, which is beneficial to reduce dark-state light leakage of LCD products, thereby improving the contrast ratio of the LCD products. It can be known that by adjusting the material of the barrier layer 21 and improving an etching rate ratio of the barrier layer to the electrode layer, an undercut structure can be prevented and meanwhile the protruding part 211 having the longer length can be formed more easily.

Specifically, the protruding part 211 is formed by all or a part of a thickness area of the barrier layer 21.

At a same time, it should be noted that the present disclosure does not limit the protruding part 211 to be a specific shape or structure, as long as the orthographic projection of the protruding part 211 on the composite electrode protrudes beyond the orthographic projection of the electrode layer 22 on the composite electrode. For example, the protruding part 211 may be constituted by the overall thickness area of the barrier layer 21 extending along an inclined direction intersected with the composite electrode, and a side of the protruding part 211 is a broken line.

In other embodiments, the protruding part 211 is constituted by the overall thickness area of the barrier layer 21 extending along the inclined direction intersected with the composite electrode.

Specifically, the protruding part 211 is formed by all or the part of the thickness area of the barrier layer 21.

For example, in this embodiment, the side of the protruding part 211 has a bending structure. In other embodiments, the protruding part 211 is constituted by the overall thickness area of the barrier layer 21 extending along the inclined direction intersected with the composite electrode.

It should be noted that the embodiment of the present disclosure is not limited to this, for example, the barrier layer 21 may also extend along an inclined direction intersected with an adhesion layer 10 to have the protruding part 211, as long as the orthographic projection of the protruding part 211 on the composite electrode protrudes beyond the orthographic projection of the electrode layer 22 on the composite electrode.

Specifically, a material of the electrode layer 22 is copper. In an etching process, stability of the metal oxide in the barrier layer 21 is better than stability of copper, which allows an etching rate of the barrier layer 21 to be lower than an etching rate of the electrode layer 22.

For example, since MoTi—TiO2 has the lower etching rate than copper, the longer protruding part (tail) 211 can be obtained, which is beneficial to reduce the dark-state light leakage of LCD products, thereby improving the contrast ratio of the LCD products.

It should be noted that the present disclosure does not limit the electrode layer 22 to have a specific material or structure. In a specific embodiment, the electrode layer 22 may be a single layered structure or multi-layered stacked structure. For example, in this embodiment, the electrode layer 22 is the single layered structure.

Specifically, the thin film transistor 100 includes a substrate 110, a gate electrode 120, a gate insulating layer 130, an active layer 140, a source electrode 150, and a drain electrode 160. The composite electrode includes at least one of the gate electrode 120, the source electrode 150, or the drain electrode 160.

For example, as shown in FIG. 1, in this embodiment, the composite electrode includes the gate electrode 120, the source electrode 150, and the drain electrode 160. That is, the composite electrode includes a composite electrode 20a having a gate electrode pattern, a composite electrode 20b having a source electrode pattern, and a composite electrode 20c having a drain electrode pattern. A specific structure of the thin film transistor 100 of the present disclosure will be described in detail below with reference to FIG. 1.

The substrate 110 uses a polymer material having light transmittance and flexibility. For example, the substrate 110 may include polyimide, polysiloxane, epoxy resins, acrylic resins, polyester, and/or similar materials. In an embodiment, the substrate 110 may include polyimide.

As shown in FIG. 1, the gate electrode 120 is disposed on the substrate 110. The gate electrode 120 is the composite electrode 20a having the gate electrode pattern. That is, the gate electrode 120 includes the barrier layer 21 and the electrode layer 22 stacked on the substrate 110 in sequence.

As shown in FIG. 1, the gate insulating layer 130 is disposed on the gate electrode 120 and covers the barrier layer 21 of the gate electrode 120, the electrode layer 22 of the gate electrode 120, and the substrate 110.

In a specific embodiment, the gate insulating layer 130 may include silicon oxide, silicon nitride, silicon oxynitride, and/or similar materials. These materials may be used singly or in a combination.

As shown in FIG. 1, the active layer 140 is disposed on the gate insulating layer 130. The active layer 140 includes a channel area, and a source area and a drain area positioned in a periphery of the channel area. Wherein, the channel area is configured to be a channel for moving or transporting charges, and the source area and the drain area are respectively configured to be electrically connected to or in contact with the source electrode 150 and the drain electrode 160.

In a specific embodiment, the active layer 140 may include silicon compounds such as polysilicon. In some embodiments, the source area and the drain area including p-type or n-type dopants may be formed at two ends of the active layer 140. In some embodiments, the active layer 140 may also include oxide semiconductors, such as indium gallium zinc oxide (IGZO), zinc tin oxide (ZTO), indium tin zinc oxide (ITZO), and/or similar materials.

As shown in FIG. 1, the source electrode 150 and the drain electrode 160 are disposed on the active layer 140. The source electrode 150 is the composite electrode 20b having the source electrode pattern, and the drain electrode 160 is the composite electrode 20c having the drain electrode pattern. That is, the source electrode 150 and the drain electrode 160 each respectively include the barrier layer 21 and the electrode layer 22. Specifically, the barrier layer 21 and the electrode layer 22 of the source electrode 150 are stacked on the source area of the active layer 140 in sequence. The barrier layer 21 and the electrode layer 22 of the drain electrode 160 are stacked on the drain area of the active layer 140 in sequence.

As shown in FIG. 1, the thin film transistor 100 further includes a planarization layer 170. The planarization layer 170 is disposed on the source electrode 150 and the drain electrode 160 and covers the active layer 140, the barrier layer 21, and the electrode layer 22 of the source electrode 150, the barrier layer 21 and the electrode layer 22 of the drain electrode 160, and the gate insulating layer 130.

An area of the planarization layer 170 corresponding to the drain electrode 160 is provided with a first through-hole 171. The first through-hole 171 exposes the electrode layer 22 of the drain electrode 160, which is configured to electrically connecting the drain electrode 160 to a subsequent pixel electrode layer 180.

In a specific embodiment, the planarization layer 170 may be formed by a polymer material or an inorganic material.

As shown in FIG. 1, the thin film transistor 100 also includes a pixel electrode 180, and the pixel electrode 180 is disposed on the planarization layer 170 and is electrically connected to the drain electrode 160 by the first through-hole 171.

In a specific embodiment, a material of the pixel electrode 180 is a metal, an alloy, or a metal nitride. For example, the pixel electrode 180 may include a metal of aluminum (Al), silver (Ag), tungsten (W), copper (Cu), nickel (Ni), chromium (Cr), molybdenum (Mo), titanium (Ti), platinum (Pt), tantalum (Ta), or neodymium (Nd), an alloy thereof, and/or a nitride thereof. These may be used singly or in a combination. The pixel electrode 180 includes at least two metal layers having different physical and/or chemical properties.

It should be noted that the present disclosure does not limit a type or structure of the thin film transistor 100. The thin film transistor having a bottom-gate structure shown in FIG. 1 is only an illustrated structural diagram, and in a specific embodiment, the thin film transistor 100 may also use thin film transistors having other structures or types. For example, the thin film transistor 100 may also be a top-gate type indium gallium zinc oxide (IGZO) TFT, a top-gate type indium gallium zinc titanium oxide (IGZTO) TFT, or a back-channel etched (BCE) type IGZO TFT.

In addition, the present disclosure does not limit relationships between barrier layers 21 and electrode layers 22 of a plurality of composite electrodes in the thin film transistor 100, either. That is, in a specific embodiment, materials of the barrier layers 21 and materials of the electrode layers 22 in different composite electrodes in a same thin film transistor 100 can be respectively disposed or disposed together. For example, in the same thin film transistor, the barrier layers 21 of the gate electrode 120, the source electrode 150, and the drain electrode 160 can use different materials.

The present disclosure provides a manufacturing method of the thin film transistor, which includes a step of manufacturing the composite electrode on the substrate. Wherein, the composite electrode includes the barrier layer and the electrode layer, the barrier layer has the protruding part relative to the electrode layer, the orthographic projection of the protruding part on the electrode layer protrudes beyond the electrode layer, and the length of the protruding part ranges from 0.3 um to 0.5 um.

The manufacturing method thereof of the present disclosure can obtain the barrier layer 21 having the longer protruding part 211, which can relieve light leakage, thereby improving the contrast ratio of products. In addition, the manufacturing method of the present disclosure can also solve the undercut problem in existing structures of barrier layer/electrode layer.

Wherein, the manufacturing method of the composite electrode includes following steps:
- a step of manufacturing a target material layer on the substrate, wherein, a material of the target material layer includes at least one metal and at least one metal oxide, a mass content of the metal oxide ranges from 1% to 10%, the metal is at least one of Mo, Ti, or Nb, and the metal oxide is at least one of TiO2, TaO2, WO2, or Nb2O5;
- a step of manufacturing a conductive layer on the target material layer, wherein, a material of the conductive layer is copper; and
- a step of patterning the target material layer and the conductive layer to obtain the barrier layer and the electrode layer, respectively.

The manufacturing method of the thin film transistor of the present disclosure can allow the barrier layer 21 to have the longer protruding part 211 by using specific materials to manufacture the barrier layer 21, which solves a problem of existing structures of barrier layer/electrode layer having difficulty to form protruding parts 211 and then relieves the light leakage, thereby improving the contrast ratio of products. In addition, the manufacturing method can also solve an undercut problem in existing composite electrodes.

Specifically, the manufacturing method of the thin film transistor includes following steps:
- a step of manufacturing the gate electrode on the substrate;
- a step of manufacturing the gate insulating layer on the gate electrode;
- a step of manufacturing the active layer on the gate insulating layer; and
- a step of manufacturing the source electrode and the drain electrode on the active layer.

In a preferred embodiment, the gate electrode 120, the source electrode 150, and the drain electrode 160 of the thin film transistor 100 are each independently the composite electrode of the present disclosure. The gate electrode 120 is the composite electrode 20a having the gate electrode pattern, the source electrode 150 is the composite electrode 20b having the source electrode pattern, and the drain electrode 160 is the composite electrode 20c having the drain electrode pattern. At this time, the gate electrode 120, the source electrode 150, and the drain electrode 160 can be respectively obtained by the step of manufacturing the composite electrode.

Figure 2A:
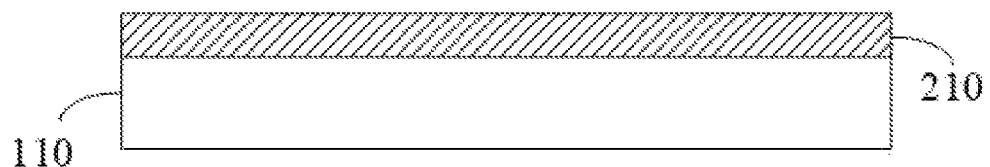
FIGS. 2A to 2C are schematic manufacturing process diagrams of a gate electrode of the thin film transistor according to an embodiment of the present disclosure. Wherein, the gate electrode is a composite electrode having a gate electrode pattern.
Figure 2B:
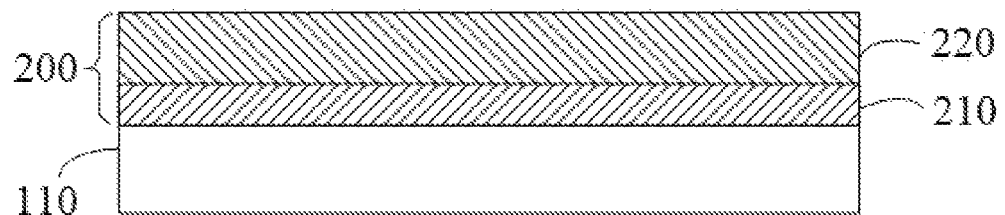
Figure 2C:
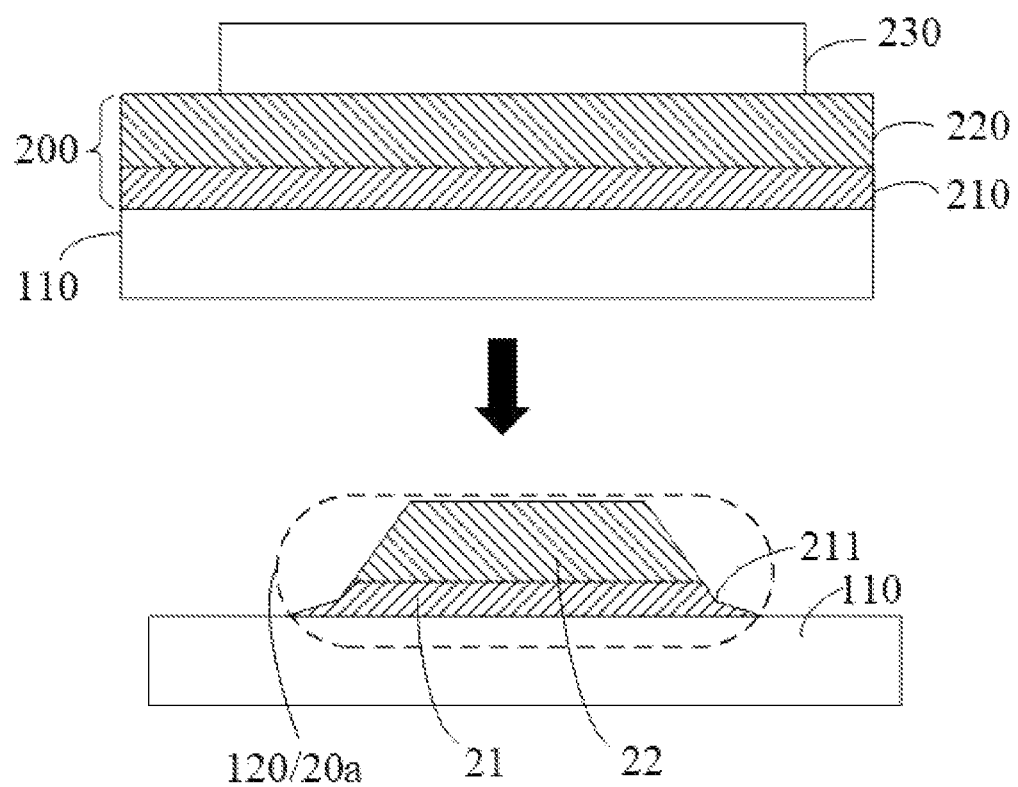

FIGS. 2A to 2C are schematic manufacturing process diagrams of the gate electrode of the thin film transistor according to an embodiment of the present disclosure. Wherein, the gate electrode is the composite electrode having the gate electrode pattern. The composite electrode and the manufacturing method of the thin film transistor in this embodiment are described in detail below in conjunction with FIGS. 2A to 2C.

As shown in FIGS. 2A to 2C, the manufacturing method of the gate electrode includes following steps:
- step S1: the step of manufacturing the target material layer on the substrate;
- step S2: the step of manufacturing the conductive layer on the target material layer; and
- step S3: the step of patterning the target material layer and the conductive layer to obtain the barrier layer and the electrode layer, respectively.

In the step S1, as shown in FIG. 2A, the target material layer 210 which is configured to manufacture the barrier layer 21 is manufactured on the substrate 110. Wherein, the material of the target material layer 210 includes at least one metal and at least one metal oxide, and the mass content of the metal oxide ranges from 1% to 10%.

Specifically, the metal is at least one of Mo, Ti, or Nb. The metal oxide is at least one of TiO2, TaO2, WO2, or Nb2O5.

For example, in this embodiment, the target material of MoTi—TiO2 is used to manufacture the target material layer 210. In a specific embodiment, the target material of MoTi—TiO2 can be obtained by a following method: Mo metal powders, Ti metal powders, and TiO2 powders are mixed at a certain ratio, followed by processes of target sintering and bonding to obtain the target material of MoTi—TiO2.

It should be noted that this embodiment does not limit a ratio of Mo to Ti. In a specific embodiment, the ratio may be adjusted according to requirements on the barrier layer 21. Wherein, the processes of target sintering and bonding can be achieved by normal processes, and are not repeated herein.

In a specific embodiment, the target material layer 210 is formed by sputtering.

In the step S2, as shown in FIG. 2B, the conductive layer 220 which is configured to manufacture the electrode layer 22 is manufactured on the target material layer 210 to obtain a composite film layer 200 of the target material layer/the conductive layer.

Specifically, the material of the conductive layer 220 may be copper. In this embodiment, after the step S2, the composite film layer 200 of (MoTi—TiO2)/Cu is obtained.

In the step 53, as shown in FIG. 2C, the composite film layer 200 obtained in the step S2 is etched to obtain the composite electrode 20a having the gate electrode pattern, that is, the gate electrode 120. Specifically, in the composite film layer 200 mentioned above, the target material layer 210 forms the barrier layer 21, and the conductive layer 220 forms the electrode layer 22.

As shown in FIG. 2C, in a specific embodiment, a photoresist layer 230 having the gate electrode pattern is manufactured on the conductive layer 220 by photolithography, and then the composite film layer 200 is etched using an acidic cupric etching solution of a hydrogen peroxide system.

In the above etching process, since the metal oxide in the target material layer 210 has stronger stability, in a cupric acid environment, an etching rate of the target material layer 210 is lower than an etching rate of the conductive layer 220. Therefore, a longer tail can be obtained in the process of etching the composite film layer 200 of the target material layer/the conductive layer.

For example, in this embodiment, since MoTi—TiO2 has the lower etching rate than copper, the barrier layer 21 of MoTi—TiO2 after etching has the longer protruding part (tail) 211, which is beneficial to reduce the dark-state light leakage of LCD products, thereby improving the contrast ratio of the LCD products.

Wherein, both the composite electrode 20b having the source electrode pattern and the composite electrode 20c having the drain electrode pattern can be realized by the manufacturing method of the composite electrode 20a having the gate electrode pattern, and are not repeated herein.

The manufacturing method of the thin film transistor of the present disclosure can obtain the barrier layer 21 having the longer protruding part 211 by the target material layer 210 using specific materials and the conductive layer 220 using specific materials, which can relieve light leakage, thereby improving the contrast ratio of products. In addition, the target material layer 210 using the specific materials can also solve the undercut problem in existing structures of barrier layer/electrode layer.

The thin film transistor and the manufacturing method thereof provided by the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A thin film transistor, comprising:
    a substrate;
    an electrode layer, made of copper; and
    a barrier layer, disposed between the substrate and the electrode layer,
    wherein the barrier layer has a protruding part relative to both sides of the electrode layer, an orthographic projection of the protruding part on the electrode layer protrudes beyond the electrode layer, and a length of the protruding part ranges from 0.3 um to 0.5 um; and
    a material of the barrier layer comprises at least one metal and at least one metal oxide, a mass content of the metal oxide ranges from 1% to 10%.

2. The thin film transistor according to claim 1, wherein the metal is at least one of Mo, Ti, and Nb.

3. The thin film transistor according to claim 1, wherein the metal oxide is at least one of $TiO_2$, $TaO_2$, $WO_2$, and $Nb_2O_5$.

4. The thin film transistor according to claim 1, wherein the material of the barrier layer comprises Mo, Ti, and $TiO_2$.

5. The thin film transistor according to claim 1, comprising a gate electrode, a source electrode, and a drain electrode;
    wherein at least one of the gate electrode, the source electrode, and the drain electrode comprises the electrode layer and the barrier layer.

6. A thin film transistor, comprising at least one composite electrode comprising a barrier layer and an electrode layer made of copper;
    wherein the barrier layer has a protruding part relative to both sides of the electrode layer, an orthographic projection of the protruding part on the electrode layer protrudes beyond the electrode layer, and a length of the protruding part ranges from 0.3 um to 0.5 um.

7. The thin film transistor according to claim 6, wherein a material of the barrier layer comprises at least one metal and at least one metal oxide, and a mass content of the metal oxide ranges from 1% to 10%.

8. The thin film transistor according to claim 7, wherein the metal is at least one of Mo, Ti, and Nb.

9. The thin film transistor according to claim 7, wherein the metal oxide is at least one of $TiO_2$, $TaO_2$, $WO_2$, and $Nb_2O_5$.

10. The thin film transistor according to claim 8, wherein the material of the barrier layer comprises Mo, Ti, and $TiO_2$.

11. The thin film transistor according to claim 6, comprising a gate electrode, a source electrode, and a drain electrode;
    wherein the composite electrode comprises at least one of the gate electrode, the source electrode, and the drain electrode.

12. A thin film transistor, comprising at least one composite electrode comprising a barrier layer and an electrode layer;
    wherein the barrier layer has a protruding part relative to both sides of the electrode layer, the protruding part protrudes beyond all edges of the electrode layer to shield the edges of the electrode layer, and a length of the protruding part ranges from 0.3 um to 0.5 um.

13. The thin film transistor according to claim 12, further comprising a substrate, wherein the barrier layer is disposed between the substrate and the electrode layer.

14. The thin film transistor according to claim 12, wherein a material of the barrier layer comprises at least one metal and at least one metal oxide, and a mass content of the metal oxide ranges from 1% to 10%.

15. The thin film transistor according to claim 14, wherein the metal is at least one of Mo, Ti, and Nb.

16. The thin film transistor according to claim 14, wherein the metal oxide is at least one of $TiO_2$, $TaO_2$, $WO_2$, and $Nb_2O_5$.

17. The thin film transistor according to claim 14, wherein the material of the barrier layer comprises Mo, Ti, and $TiO_2$.

18. The thin film transistor according to claim 17, wherein the material of the barrier layer is MoTi—$TiO_2$.

19. The thin film transistor according to claim 18, wherein a material of the electrode layer is copper.

* * * * *